US012635150B2

(12) United States Patent　　(10) Patent No.: US 12,635,150 B2
Jung　　(45) Date of Patent: May 19, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventor: Sung Wook Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 393 days.

(21) Appl. No.: 18/366,686

(22) Filed: Aug. 8, 2023

(65) Prior Publication Data

US 2024/0381671 A1　　Nov. 14, 2024

(30) Foreign Application Priority Data

May 10, 2023　(KR) ........................ 10-2023-0060352

(51) Int. Cl.
*H10B 80/00* (2026.01)
*H10W 72/20* (2026.01)
*H10W 90/00* (2026.01)
*H10W 80/00* (2026.01)

(52) U.S. Cl.
CPC ............ *H10B 80/00* (2023.02); *H10W 72/20* (2026.01); *H10W 90/00* (2026.01); *H10W 80/312* (2026.01); *H10W 80/327* (2026.01); *H10W 90/792* (2026.01)

(58) Field of Classification Search
CPC ........ H10B 80/00; H10B 43/27; H10B 43/40; H10B 43/50; H10B 41/40; H01L 24/16; H01L 24/80; H01L 25/0657; H01L 25/18; H01L 25/50; H01L 2224/08145; H01L 2224/80895; H01L 2224/80896; H01L 2924/1431; H01L 2924/14511; H01L 2225/06541; H01L 24/08; H10W 72/20; H10W 90/00; H10W 80/312; H10W 90/792

See application file for complete search history.

(56) References Cited

U.S. PATENT DOCUMENTS

| | | | | |
|---|---|---|---|---|
| 11,367,733 | B1 | 6/2022 | Hosoda et al. | |
| 2021/0375901 | A1 * | 12/2021 | Oh | ......... H10B 43/40 |
| 2021/0383874 | A1 * | 12/2021 | Oh | ......... H01L 25/18 |
| 2022/0077129 | A1 * | 3/2022 | Sung | ...... H10B 43/27 |
| 2022/0344361 | A1 * | 10/2022 | Jeon | ...... H10B 41/27 |
| 2024/0081062 | A1 * | 3/2024 | Kim | ......... H01L 24/08 |
| 2024/0203943 | A1 * | 6/2024 | Kim | ......... H10B 80/00 |
| 2024/0381672 | A1 * | 11/2024 | Jung | ...... H01L 24/80 |

FOREIGN PATENT DOCUMENTS

KR　　10-2022-0042932 A　　4/2022

* cited by examiner

*Primary Examiner* — Thanh Y. Tran
(74) *Attorney, Agent, or Firm* — IP & T GROUP LLP

(57) ABSTRACT

A semiconductor device may include: first semiconductor structure including a page buffer, a first peripheral circuit, a bit line located on the page buffer, a stack located on the bit line and the stack including a) a step structure, b) a source structure located on the stack, and channel structures extending through the stack; and a second semiconductor structure bonded to the first semiconductor structure and the second semiconductor structure including a) a second peripheral circuit located to face the source structure and b) pass transistors located to face the step structure.

18 Claims, 6 Drawing Sheets

FIG. 4B

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2023-0060352 filed on May 10, 2023, which is incorporated herein by reference in its entirety.

BACKGROUND

1. Technical Field

Embodiments of the present disclosure relate to an electronic device and a manufacturing method of the electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate is reaching a limit, a three-dimensional semiconductor device for stacking memory cells on a substrate has been considered. Furthermore, in order to improve the operational reliability of such a three-dimensional semiconductor device, various structures and manufacturing methods have been developed.

SUMMARY

In one embodiment, a semiconductor device may include: a first semiconductor structure including a page buffer, a first peripheral circuit, a bit line located on the page buffer, a stack located on the bit line and the stack including a) a step structure, b) a source structure located on the stack, and channel structures extending through the stack; and a second semiconductor structure bonded to the first semiconductor structure and the second semiconductor structure including a) a second peripheral circuit located to face the source structure and b) pass transistors located to face the step structure.

In another embodiment, a manufacturing method of a semiconductor device may include: forming a first semiconductor structure including a page buffer, a first peripheral circuit, a bit line located on the page buffer, a stack located on the bit line and the stack including a) a step structure, b) a source structure located on the stack, and c) channel structures extending through the stack; forming a second semiconductor structure including pass transistors and a second peripheral circuit; and bonding the first semiconductor structure and the second semiconductor structure to each other.

BRIEF DESCRIPTION OF THE DRAWINGS

FIGS. 4A to 4C are diagrams for describing a manufacturing method of a semiconductor device in accordance with further embodiments.

DETAILED DESCRIPTION

Various embodiments are directed to a semiconductor device having a stable structure and improved characteristics and a manufacturing method of the semiconductor device.

The present technology can provide a semiconductor device having a stable structure and improved reliability.

Hereafter, embodiments in accordance with the technical spirit of the present disclosure will be described with reference to the accompanying drawings.

Figure 1:
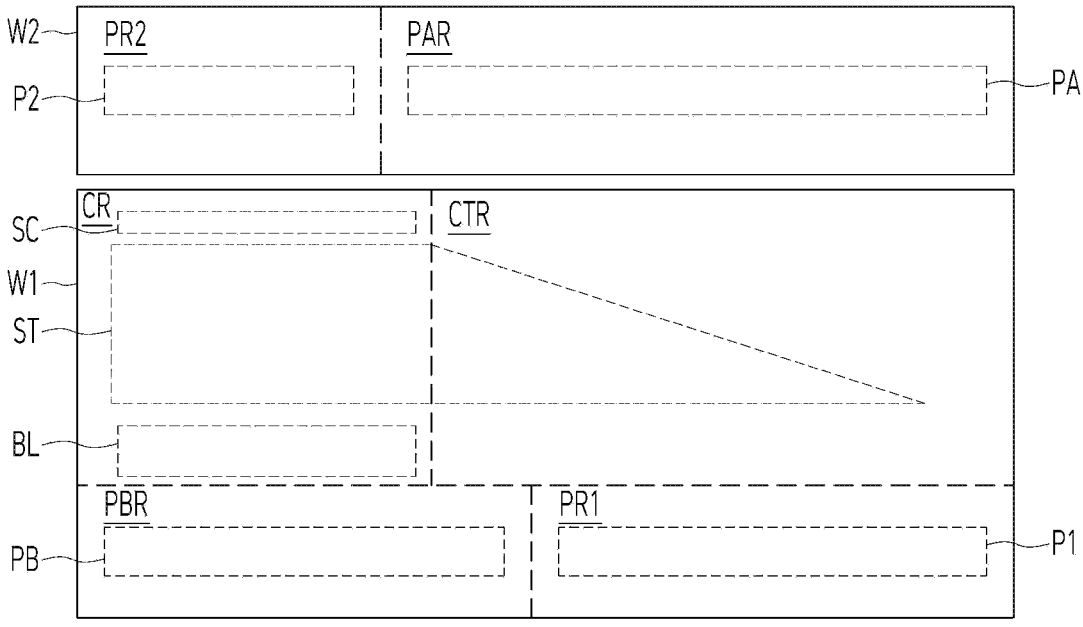
FIG. 1 is a diagram for describing a semiconductor device in accordance with one embodiment.

FIG. 1 is a diagram for describing a semiconductor device in accordance with one embodiment.

Referring to FIG. 1, the semiconductor device may include a first wafer W1 or a second wafer W2, or a combination thereof. The wafers W1 and W2 may each refer to a structure including a substrate or including no substrate. For example, the wafers W1 and W2 may each refer to a structure including no substrate and including various components, for example, channel structures, interconnection structures, peripheral circuits, and the like.

The first wafer W1 may include a cell region CR and a contact region CTR. The first wafer W1 may include a first peripheral circuit region PR1 and a page buffer region PBR. For example, the first peripheral circuit region PR1 and the page buffer region PBR may be located below the cell region CR and the contact region CTR.

The cell region CR may be a region where stacked memory cells are located. For example, a cell array including memory strings may be located in the cell region CR. The contact region CTR may be a region where an interconnection structure is located. The interconnection structure may provide a path through which a bias for driving the stacked memory cells is transmitted. For example, the interconnection structure may include contact plugs, contact vias, wire lines, or the like.

A source structure SC, a bit line BL, or a stack ST may be located in the cell region CR. The stack ST may be located in the cell region CR, and may extend to the contact region CTR. The stack ST may or might not include a step structure. The step structure of the stack ST may be located in the contact region CTR. The stack ST may include stacked conductive layers. For example, the stack ST may include gate lines. The gate line may be a word line, a source select line, and a drain select line. The gate line may be a local line connected to a global line through pass transistors PA. The source structure SC may be located above or below the stack ST. The bit line BL may be located above or below the stack ST. For example, the source structure SC may be located below the stack ST, and the bit line BL may be located above the stack ST. In another example, the source structure SC may be located above the stack ST, and the bit line BL may be located below the stack ST.

An interconnection structure for electrical connection to the stack ST or the memory cells of the cell region CR may be located in the contact region CTR. For example, the step structure or an inverted step structure of the stack ST may be located in the contact region CTR. Contact plugs for electrical connection to the conductive layers of the stack ST may be located in the contact region CTR. For example, when the stack ST has a step structure, conductive layers exposed through the step structure may be electrically connected to the contact plugs, respectively. When the stack ST has no step structure, the contact plugs may extend through the stack ST and be electrically connected to the conductive layers, respectively. Alternatively, the conductive layers may be bent so that upper surfaces of the conductive layers are exposed, so that the conductive layers may be electrically connected to the contact plugs, respectively. In this case, heights of the contact plugs may be substantially the same. The memory cells may receive voltages through the contact plugs and the conductive layers.

The first peripheral circuit region PR1 may include a first peripheral circuit P1, and the page buffer region PBR may include a page buffer PB. The page buffer may be connected to the bit line BL, and a read operation or a program operation of the memory cell may be performed using the page buffer PB. For example, data sensed from a selected memory cell may be temporarily stored in a latch of the page buffer PB, or a voltage or current of the bit line BL may be sensed by using the page buffer PB after the start of a read operation or a verify operation. The first peripheral circuit P1 may include a data input/output circuit or a logic circuit that controls the page buffer PB.

The second wafer W2 may include a second peripheral circuit region PR2 and a pass transistor region PAR. The second peripheral circuit region PR2 may include a second peripheral circuit P2, and the pass transistor region PAR may include a row decoder. The row decoder may include a pass transistor PA. The first peripheral circuit P1 may include a voltage generator that supplies a voltage to the stack ST. The voltage generator may adjust a voltage supplied from the outside and generate an operating voltage supplied to the global line. The pass transistor PA may control a connection between the global line and a local line. For example, a bias of the global line may be transmitted to the local line by turning on the pass transistor PA.

The second wafer W2 may be located above the first wafer W1. The first wafer W1 and the second wafer W2 may be bonded to each other. For example, the second wafer W2 may be inverted and bonded to the top of the first wafer W1. Accordingly, the first wafer W1 and the second wafer W2 may be electrically connected to each other.

The cell region CR may be located to face the page buffer region PBR, and the contact region CTR may be located to face the first peripheral circuit region PR1. In other words, the bit line BL may be located to face the page buffer region PBR, and the step structure or the contact plugs may be located to face the first peripheral circuit P1. The cell region CR may be located to face the second peripheral circuit region PR2 and the contact region CTR may be located to face the pass transistor region PAR. In other words, the source structure SC may be located to face the second peripheral circuit P2, and the step structure or the contact plugs may be located to face the pass transistor region PAR.

The bit line BL of the cell region CR of the first wafer W1 may be located adjacent to the page buffer region PBR, and the contact plugs of the contact region CTR of the first wafer W1 may be located adjacent to the pass transistor region PAR of the second wafer W2. Accordingly, the page buffer PB may receive and sense the voltage or current of the bit line BL of the cell region CR in the shortest distance, and the pass transistor PA may adjust whether the voltage is supplied and then transmit the voltage to the contact plugs of the contact region CTR in the shortest distance.

However, the present disclosure is not limited to bonding the first wafer W1 and the second wafer W2 as described above. For example, a separate wafer including the first peripheral circuit P1 and the page buffer PB may be formed and bonded to the first wafer W1. The first wafer W1 might not include the first peripheral circuit P1 and the page buffer PB. In other words, the first wafer W1 may mainly include a memory cell array, and separate wafers may mainly include circuits related to an operation of the memory cell array. Accordingly, since more memory cells may be placed on the first wafer W1, more data may be stored.

According to the structure described above, the first wafer W1 may mainly include the memory cell array, and the second wafer W2 may mainly include circuits related to the operation of the memory cell array of the first wafer W1. Accordingly, by configuring the circuits related to the operation of the memory cell array to be included in the second wafer W2, more memory cells may be placed on the first wafer W1 and more data may be stored.

Furthermore, the first wafer W1 and the second wafer W2 may be bonded to each other so that the step structure or contact plugs of the contact region CTR and the pass transistor PA are adjacent to each other, and the bit line BL of the cell region CR and the page buffer PB may be formed adjacent to each other. Accordingly, the page buffer PB and the bit line BL may be disposed adjacent to each other, and a program operation and a read operation may be improved. The pass transistor PA and the contact plugs may be disposed adjacent to each other, and the length of a bias transmission path may be reduced.

Figure 2:
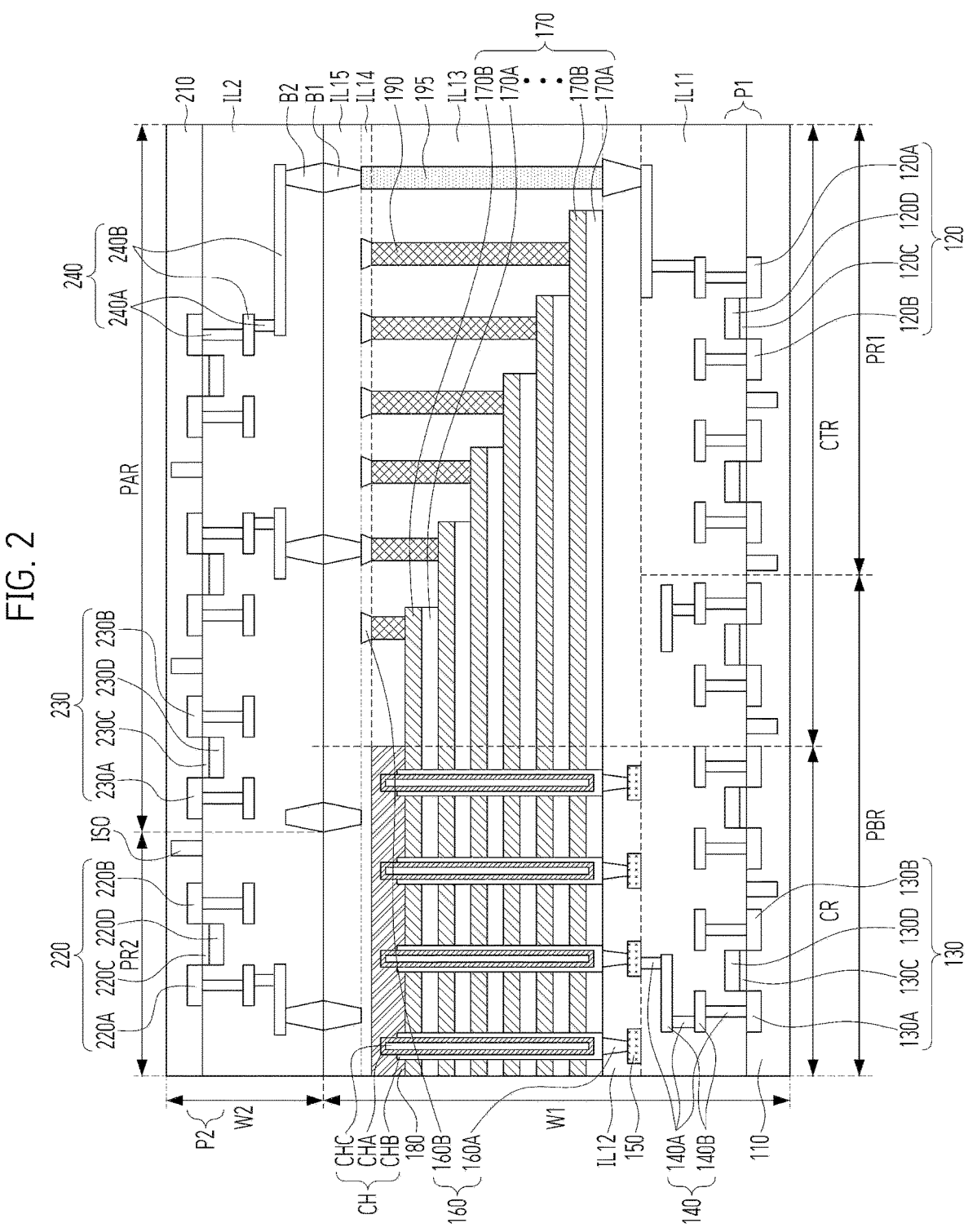
FIG. 2 is a diagram for describing a semiconductor device in accordance with another embodiment.

FIG. 2 is a diagram for describing a semiconductor device in accordance with another embodiment. Hereinafter, the content overlapping with the previously described content will be omitted.

Referring to FIG. 2, the semiconductor device may include a first wafer W1 or a second wafer W2, or a combination thereof.

The first wafer W1 may include a cell region CR, a contact region CTR, a page buffer region PBR, and a first peripheral circuit region PR1. The first wafer W1 may include a stack 170, a source structure 180, a bit line 150, a first peripheral circuit P1, or a page buffer. The first wafer W1 may further include channel structures CH, first contact plugs 190, second contact plugs 195, first bonding pads B1, or a first interconnection structure 140, or a combination thereof. The first wafer W1 may refer to a structure including a substrate or including no substrate. For example, the first wafer W1 may refer to a first semiconductor structure including the stack 170, the source structure 180, the bit line 150, the first peripheral circuit P1, the page buffer, the channel structures CH, the first contact plugs 190, the second contact plugs 195, the first bonding pads B1, or the first interconnection structure 140, or a combination thereof.

The stack 170 may be located in the cell region CR. The stack 170 may extend to the contact region CTR. The stack 170 may include a step structure. The stack 170 may include insulating layers 170A and conductive layers 170B that are alternately stacked. The conductive layers 170B may be exposed through an inverted step structure. The conductive layers 170B may be local lines such as for example word lines, source select lines, or drain select lines. The insulating layers 170A may each include an insulating material such as for example an oxide, and the conductive layers 170B may each include a conductive material such as for example tungsten or molybdenum.

The source structure 180 may be located in the cell region CR. The source structure 180 may be located above the stack 170. The source structure 180 may be located adjacent to the second wafer W2.

The channel structures CH may be located in the cell region CR. The channel structures CH may each include a channel layer CHA, a memory layer CHB surrounding the channel layer CHA, or an insulating core CHC in the channel layer CHA, or a combination thereof. The channel structures CH may extend through the stack 170. For example, the channel structures CH may extend through the stack 170 and be connected to the source structure 180. The channel layer CHA may be directly connected to the source structure 180 or may be connected to the source structure 180 through an epitaxial pattern.

For reference, the stack 170 of the first wafer W1 may include a first stack and a second stack on the first stack. The channel structures CH may be located in the first stack and the second stack, respectively, and the channel structures CH of the first stack and the channel structures CH of the second stack may be connected to each other.

The bit line 150 may be located in the cell region CR. The bit line 150 may be located below the stack 170. The bit line 150 may be located adjacent to the page buffer region PBR and may be spaced apart from the second wafer W2. The channel structures CH may be located between the bit line 150 and the source structure 180.

The first contact plugs 190 may be located in the contact region CTR. The first contact plugs 190 may be located adjacent to the second wafer W2. For example, the first contact plugs 190 may be located adjacent to the second wafer W2 compared to the bit line 150. The first contact plugs 190 may be connected to the conductive layers 170B, respectively. The conductive layers 170B and the second wafer W2 may be electrically connected to each other through the first contact plugs 190. For example, the first contact plugs 190 may be electrically connected to pass transistors 230 of the second wafer W2, respectively. The first contact plugs 190 may be located in an interlayer dielectric layer IL13. The first contact plugs 190 may each include a conductive material such as for example tungsten.

The second contact plug 195 may be located in the contact region CTR. The second contact plug 195 may extend through the first wafer W1 to electrically connect the first wafer W1 and the second wafer W2. For example, the second contact plug 195 may electrically connect the first wafer W1 and the second wafer W2 through the first bonding pad B1 and a second bonding pad B2. Furthermore, the second contact plug 195 may electrically connect the second wafer W2 and the first peripheral circuit P1 of the first wafer W1. The second contact plug 195 may include a conductive material such as for example tungsten.

The page buffer may be located on a substrate 110 and may be located in the page buffer region PBR. The page buffer may be located to face the bit line 150. A transistor 130 may be included in the page buffer. The transistor 130 may include junctions 130A and 130B, a gate insulating layer 130C, or a gate electrode 130D. The page buffer may be connected to the bit line 150, and a read operation or a program operation of a memory cell may be performed using the page buffer. The page buffer may be electrically connected to the bit line 150 through the first interconnection structure 140. The page buffer may temporarily store data sensed from a selected memory cell in a latch of the page buffer, or may sense a voltage or current of the bit line 150 by using the page buffer after the start of a read operation or a verify operation.

The first peripheral circuit P1 may be located in the first peripheral circuit region PR1. The first peripheral circuit P1 may be located to face the step structure of the stack 170. The first peripheral circuit P1 may include a data input/ output circuit or a logic circuit that controls the page buffer. The first peripheral circuit P1 may be electrically connected to the second contact plug 195 through the first interconnection structure 140. The first peripheral circuit P1 may include a transistor 120. The transistor 120 may include junctions 120A and 120B, a gate insulating layer 120C, and a gate electrode 120D, as shown.

The first bonding pad B1 may be located above the stack 170. For example, the first bonding pad B1 may be located above the source structure 180. The first bonding pad B1 may be located in an interlayer dielectric layer IL15. The first bonding pad B1 may connect the first wafer W1 and the second wafer W2 to each other. For example, the top of the first wafer W1 and the top of the second wafer W2 may be bonded to each other through one or more bonding pads such the first bonding pad B1. The first bonding pad B1 may be electrically connected to the first contact plugs 190. For example, the first bonding pad B1 may electrically connect the first contact plugs 190 and the pass transistor 230 of the second wafer W2.

The first interconnection structure 140 may include first connection plugs 140A or first wire lines 140B, or a combination thereof. The first connection plugs 140A may be connected to the transistors 120 and 130. The first wire line 140B may connect the first connection plugs 140A to each other. The first interconnection structure 140 may be located in an interlayer dielectric layer IL11.

The second interconnection structure 160 may include second connection plugs 160A or second wire lines 160B, or a combination thereof. The second connection plugs 160A may connect the bit line 150 and the channel structures CH. The second connection plugs 160A may be located in an interlayer dielectric layer IL12. The interlayer dielectric layer IL12 may be located on the interlayer dielectric layer IL11. At least one of the second wire lines 160B may connect at least one of the first contact plugs 190 and at least one of the first bonding pads B1. The second wire lines 160B may be located in an interlayer dielectric layer IL14. The interlayer dielectric layer IL14 may be located on the interlayer dielectric layer IL12.

The second wafer W2 may include a second peripheral circuit region PR2 and a pass transistor region PAR. The second wafer W2 may include a second peripheral circuit P2, pass transistors 230, second bonding pads B2, a third interconnection structure 240, a substrate 210, or an isolation insulating layer ISO, or a combination thereof. The second wafer W2 may refer to a structure including a substrate or including no substrate. For example, the second wafer W2 may refer to a second semiconductor structure including the second peripheral circuit P2, the pass transistors 230, the second bonding pads B2, the third interconnection structure 240, the substrate 210, or the isolation insulating layer ISO, or a combination thereof.

The second peripheral circuit P2 may be located in the second peripheral circuit region PR2. The second peripheral circuit P2 may be located to face the source structure 180 of the first wafer W1. The second peripheral circuit P2 may include a transistor, a capacitor, a resistor, a voltage generator, and the like. The voltage generator may generate an operating voltage to be supplied to the conductive layers 170B. For example, a voltage generator can generate an operating voltage to be supplied to a global line. The voltage generator may include a transistor 220. The transistor 220 may include junctions 220A and 220B, a gate insulating layer 220C, and a gate electrode 220D as shown. The isolation insulating layer ISO may be located in the substrate 210, and an active region of the transistor 220 may be defined by the isolation insulating layer ISO.

The pass transistors 230 may be located in the pass transistor region PAR. The pass transistors 230 may be located to face the step structure of the stack 170. The pass transistors 230 may be electrically connected to the conductive layers 170B. For example, the conductive layers 170B and the pass transistors 230 may be electrically connected to each other through the first contact plugs 190. Each of the pass transistors 230 may be a high voltage transistor. The pass transistors 230 may control a connection between the global line and a local line. For example, a bias of the global line may be transmitted to the local line by turning on the pass transistors 230. Each of the pass transistors 230 may include a first junction 230A, a second junction 230B, a gate insulating layer 230C, and a gate electrode 230D as shown. The first junction 230A and the second junction 230B may be located in the substrate 210 on both sides of the gate electrode 230D. The gate insulating layer 230C may be located between the gate electrode 230D and the substrate 210.

The second bonding pads B2 may be located above the substrate 210. The second bonding pad B2 may connect the first wafer W1 and the second wafer W2 to each other. The second bonding pad B2 may be connected to the first bonding pad B1. For example, the top of the first wafer W1 and the top of the second wafer W2 may be bonded to each other. The second bonding pads B2 may be located on the pass transistors 230 and electrically connected to the pass transistors 230. For example, the second bonding pads B2 may electrically connect the pass transistors 230 and the conductive layers 170B of the first wafer W1. Voltages supplied from the pass transistors 230 may be supplied to the conductive layers 170B through the second bonding pad B2, the first bonding pad B1, and the first contact plug 190. The second bonding pad B2 may be located in the interlayer dielectric layer IL2.

The third interconnection structure 240 may include third connection plugs 240A or third wire lines 240B, or a combination thereof. At least one of the third connection plugs 240A may be electrically connected to at least one of the pass transistors 230. The third wire lines 240B may connect the third connection plugs 240A to each other or electrically connect the third connection plug 240A and the second bonding pad B2. Accordingly, the second bonding pad B2 and the pass transistors 230 may be electrically connected to each other by the third interconnection structure 240. The third interconnection structure 240 may be located in the interlayer dielectric layer IL2.

According to the structure described above, the bit line 150 and the first contact plugs 190 of the first wafer W1 may be placed diagonally across from each other. For example, the bit line 150 may be located adjacent to the page buffer region PBR, and the first contact plugs 190 may be located adjacent to the second wafer W2. Accordingly, by efficiently disposing the bit line 150 and the first contact plugs 190, a process of forming the interconnection structures 140 and 240 for connecting the bit line 150 or the first contact plugs 190 may be simplified.

Figure 3:
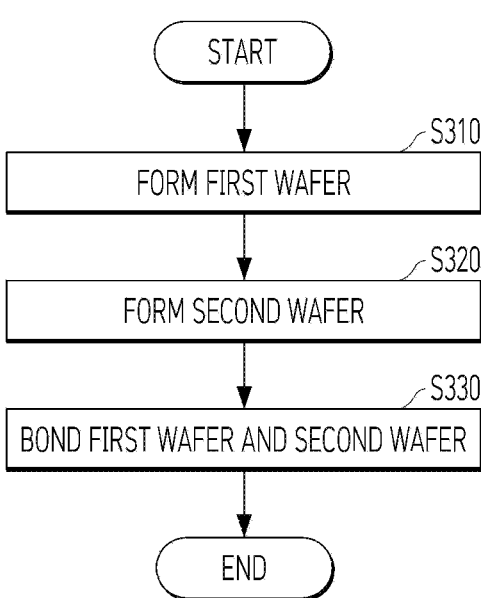
FIG. 3 is a diagram for describing a manufacturing method of a semiconductor device in accordance with still other embodiments.

FIG. 3 is a diagram for describing a manufacturing method of a semiconductor device in accordance with another embodiment. Hereinafter, the content overlapping with the previously described content will be omitted.

Referring to FIG. 3, a first wafer may be formed (S310). For example, a first wafer including a stack, a source structure, a bit line, a first peripheral circuit, or a page buffer or a combination thereof may be formed. The first wafer may refer to a structure including a substrate or including no substrate. For example, the first wafer may refer to a first semiconductor structure including a stack, a source structure, a bit line, a first peripheral circuit, or a page buffer, or a combination thereof. The stack may include a step structure. The first peripheral circuit may include a voltage generator that transmits a voltage to conductive layers of the stack.

Subsequently, a second wafer may be formed (S320). For example, the second wafer including a second peripheral circuit or pass transistors or a combination thereof may be formed. The second wafer may refer to a structure including a substrate or including no substrate. For example, the second wafer may refer to a second semiconductor structure including a second peripheral circuit or pass transistors, or a combination thereof. The second peripheral circuit may include a data input/output circuit or a logic circuit that controls a page buffer. Subsequently, the first wafer and the second wafer may be bonded to each other (S330). For example, an upper surface of the first wafer and an upper surface of the second wafer may be bonded to each other. A lower surface of the first wafer and the upper surface of the second wafer may also be bonded to each other. The bit line may be located adjacent to the page buffer, and the step structure of the stack may be bonded adjacent to the pass transistors.

According to the manufacturing method described above, structures may be efficiently disposed by forming wafers each including different structures and bonding the wafers to each other.

Figure 4A:
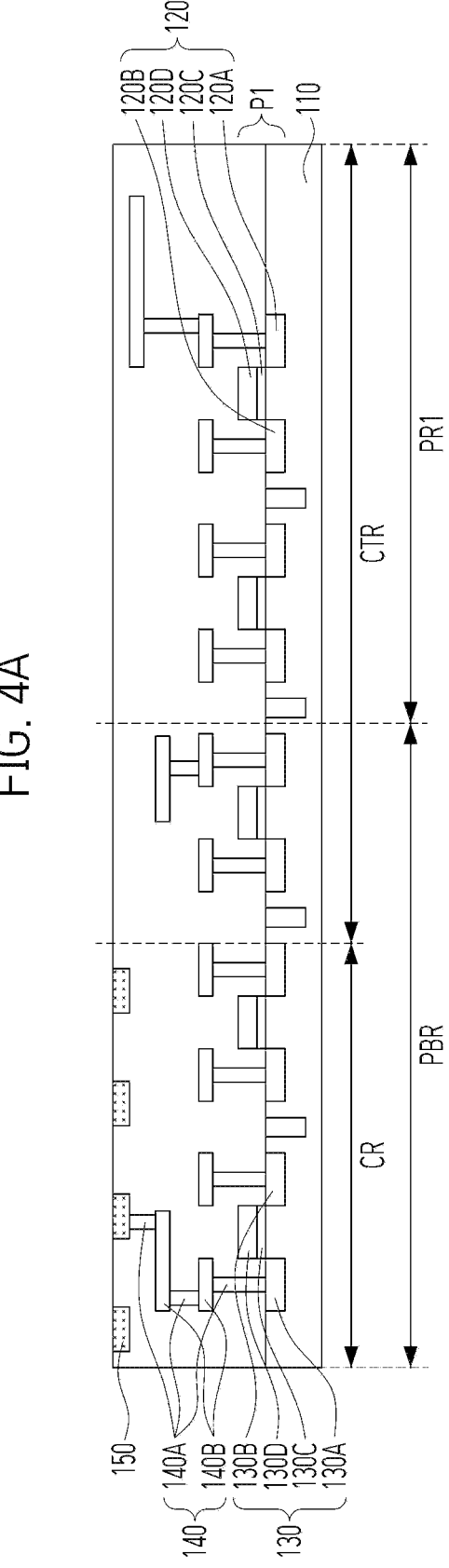
Figure 4B:
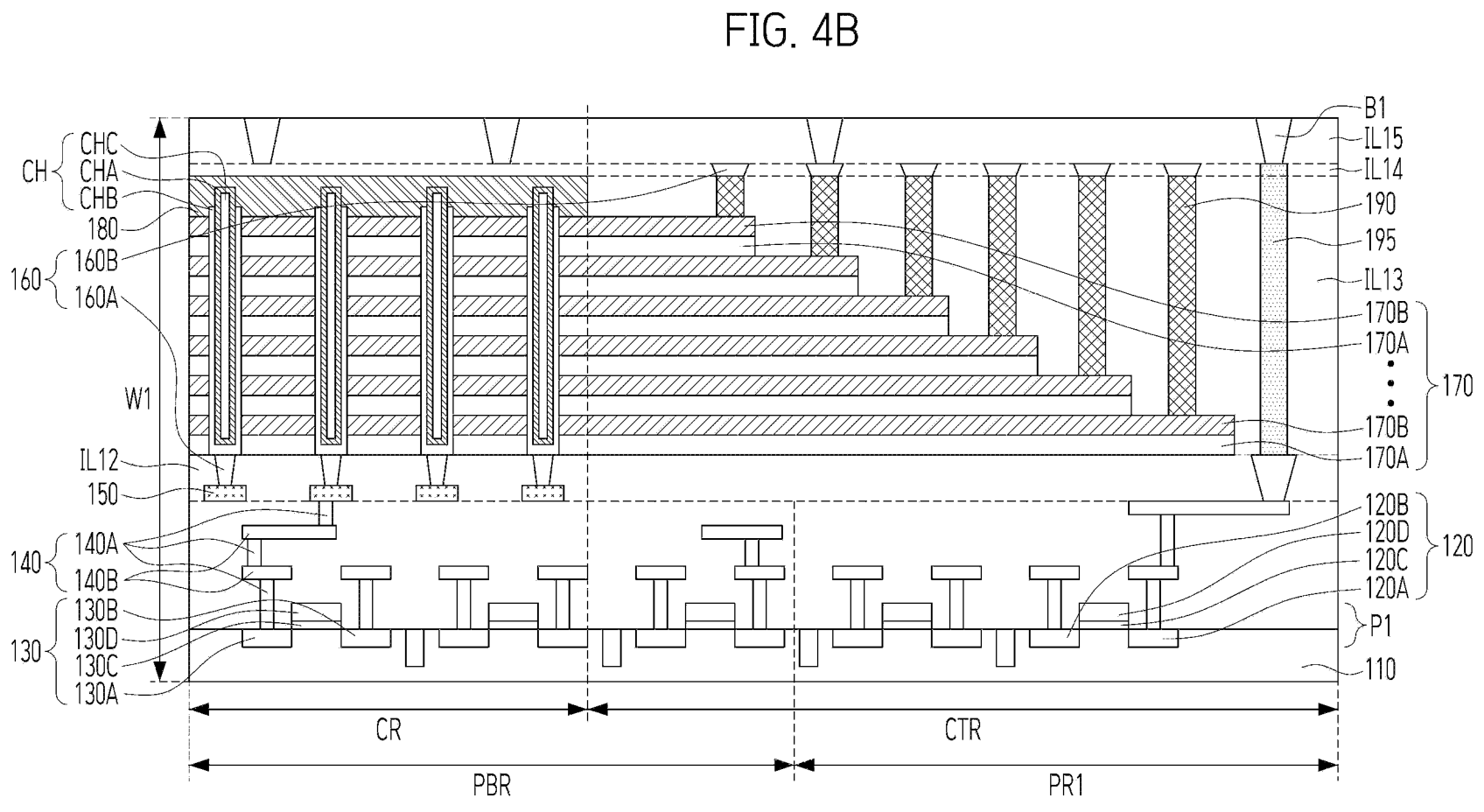
Figure 4C:
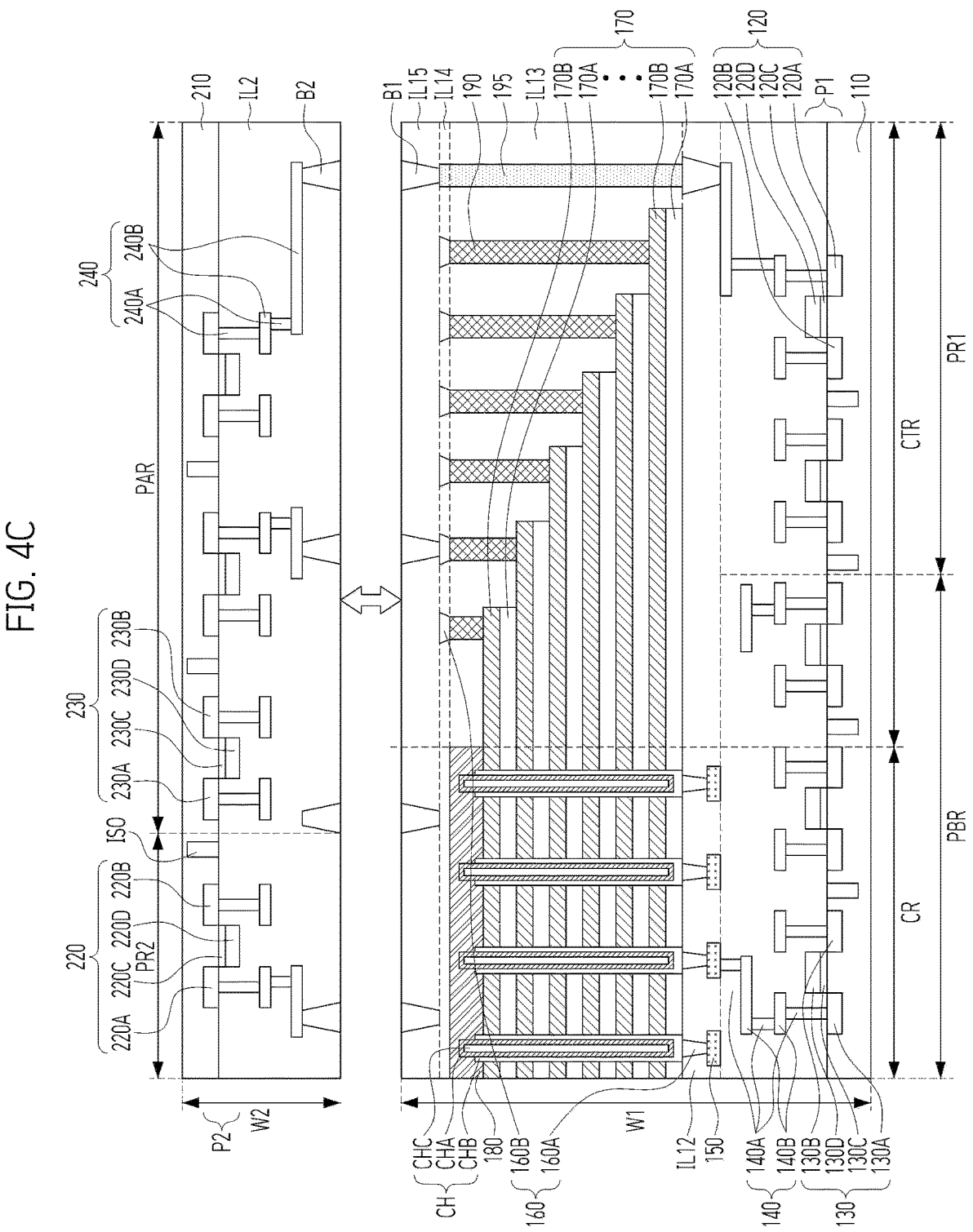

FIGS. 4A to 4C are diagrams for describing a manufacturing method of a semiconductor device in accordance with an embodiment. Hereinafter, the content overlapping with the previously described content will be omitted.

Referring to FIG. 4A, a first wafer W1 may be formed. The first wafer W1 may include a cell region CR, a contact region CTR, a page buffer region PBR, and a first peripheral circuit region PR1. The cell region CR may be located on the page buffer region PBR, and the contact region CTR may be located on the first peripheral circuit region PR1.

First, a first peripheral circuit P1 and a page buffer may be formed on a substrate 110. The first peripheral circuit P1 may be formed in the first peripheral circuit region PR1, and the page buffer may be formed in the page buffer region PBR. The first peripheral circuit P1 may include a data input/output circuit or a logic circuit that controls the page buffer. The first peripheral circuit P1 may include a transistor 120. The transistor 120 may include junctions 120A and 120B, a gate insulating layer 120C, or a gate electrode 120D.

The page buffer may temporarily store data sensed from a selected memory cell in a latch of the page buffer, or may sense a voltage or current of a bit line 150 by using the page buffer after the start of a read operation or a verify operation. A transistor 130 may be included in the page buffer. The transistor 130 may include junctions 130A and 130B, a gate insulating layer 130C, and a gate electrode 130D as shown. The transistors 120 and 130 may be formed in an interlayer dielectric layer IL11.

Subsequently, a first interconnection structure 140 may be formed on the substrate 110. The first interconnection structure 140 may include first connection plugs 140A or first wire lines 140B, or a combination thereof. The first connection plug 140A may be connected to the transistors 120 and 130. The first wire lines 140B may connect the first connection plugs 140A to each other. The first interconnection structure 140 may be formed in the interlayer dielectric layer IL11.

Referring to FIGS. 4A and 4B, a bit line 150 may be formed. The bit line 150 may be formed in the cell region CR. Accordingly, the bit line 150 may be formed on the page buffer. The bit line 150 may be formed in an interlayer dielectric layer IL12. The interlayer dielectric layer IL12 may be formed on the interlayer dielectric layer IL11.

Subsequently, second connection plugs 160A may be formed above the bit lines to connect to the bit lines 150, respectively. The second connection plug 160A may be formed in the interlayer dielectric layer IL12.

Subsequently, as shown in FIG. 4B, a preliminary stack may be formed by alternately stacking insulating layers 170A and sacrificial layers. The insulating layers 170A may each include an insulating material such as for example an oxide, and the sacrificial layers may each include a sacrificial material such as for example a nitride. The preliminary stack may include a step structure. Channel structures CH extending through the preliminary stack may be formed. Each of the channel structures CH may include a channel layer CHA, a memory layer CHB surrounding the channel layer CHA, and an insulating core CHC in the channel layer CHA, or a combination thereof. Subsequently, slits extending through the preliminary stack may be formed, and the sacrificial layers may be replaced with conductive layers 170B through the slits. Thus, a stack 170 including the insulating layers 170A and the conductive layers 170B that are alternately stacked may be defined. The stack 170 may be formed in the cell region CR and may extend to the contact region CTR. The stack 170 may include a step structure. The conductive layers 170B may be exposed through the step structure of the stack 170. The conductive layers 170B may be word lines, source select lines, or drain select lines.

However, the present disclosure is not limited thereto, and the stack 170 may also be formed by alternately stacking the insulating layers 170A and the conductive layers 170B from the beginning. The conductive layers 170B may be silicidated through the slits.

Subsequently, a source structure 180 located above the stack 170 may be formed. The source structure 180 may be formed in the cell region CR. The source structure 180 may be electrically connected to the channel structures CH. For example, the source structure 180 may be directly connected to the channel layer CHA, or may be connected to the channel layer CHA through an epitaxial pattern.

First contact plugs 190 respectively connected to the conductive layers 170B may be formed. The first contact plugs 190 may be formed in the contact region CTR. The first contact plugs 190 may extend through an interlayer dielectric layer IL13, and may be electrically connected to the conductive layers 170B, respectively. However, the present disclosure is not limited thereto, and when the stack 170 has no step structure, the first contact plugs 190 may extend through the stack 170 and may be electrically connected to the conductive layers 170B, respectively.

Subsequently, second wire lines 160B may be formed on the first contact plugs 190. Thus, a second interconnection structure 160 including the second connection plug 160A and the second wire line 160B may be defined. The second wire line 160B may be electrically connected to the first contact plugs 190. The second wire line 160B may be formed in an interlayer dielectric layer IL14. The interlayer dielectric layer IL14 may be formed on the interlayer dielectric layer IL13.

A second contact plug 195 may be formed. The second contact plug 195 may be formed in the contact region CTR. The second contact plug 195 may extend through the first wafer W1 and electrically connect the first wafer W1 and a second wafer W2. For example, the second contact plug 195 may electrically connect the first wafer W1 and the second wafer W2 through a first bonding pad B1 and a second bonding pad B2. Furthermore, the second contact plug 195 may electrically connect the second wafer W2 and the first peripheral circuit P1 of the first wafer W1. The second contact plug 195 may include a conductive material such as for example tungsten.

First bonding pads B1 may be formed on the source structure 180. However, the present disclosure is not limited thereto, and first bonding pads B1 may be formed in the cell region CR and the contact region CTR. The first bonding pads B1 may be formed in an interlayer dielectric layer IL15. The interlayer dielectric layer IL15 may be formed on the interlayer dielectric layer IL14. The first bonding pads B1 may be electrically connected to the first contact plugs 190, respectively. For example, at least one of the first bonding pads B1 may be electrically connected to the first contact plugs 190 through the second wire line 160B.

Referring to FIG. 4C, the second wafer W2 may be formed. The second wafer W2 may include a second peripheral circuit region PR2 and a pass transistor region PAR. A second peripheral circuit P2 may be formed in the second peripheral circuit region PR2. The second peripheral circuit P2 may be formed on a substrate 210 and may be formed to face the source structure 180. The second peripheral circuit P2 may include a transistor, a capacitor, a resistor, a voltage generator, and the like. The voltage generator may adjust a voltage supplied from the outside and generate an operating voltage to be supplied to a global line. The voltage generator may include a transistor 220. The transistor 220 may include junctions 220A and 220B, a gate insulating layer 220C, and a gate electrode 220D. An isolation insulating layer ISO may be formed in the substrate 210, and an active region of the transistor 220 may be defined by the isolation insulating layer ISO.

Pass transistors 230 may be formed in the pass transistor region PAR. The pass transistors 230 may be formed to face an inverted step structure of the stack 170. The pass transistors 230 may control a connection between the global line and a local line connecting to one of the first contact plugs 190 of the step structure. For example, a bias of the global line may be transmitted to the local line by turning on the pass transistors 230. Each of the pass transistors 230 may include junctions 230A and 230B, a gate insulating layer 230C, and a gate electrode 230D. The junctions 230A and 230B may be formed in the substrate 210 on both sides of the gate electrode 230D. Each of the pass transistors 230 may be a high voltage transistor.

Subsequently, second bonding pads B2 may be formed on the pass transistors 230. First, a third interconnection structure 240 may be formed on the pass transistors 230. The third interconnection structure 240 may include a third connection plug 240A or a third wire line 240B. Subsequently, the second bonding pads B2 may be formed on the third interconnection structure 240. The third interconnection structure 240 and the second bonding pads B2 may be formed in the interlayer dielectric layer IL2. The second bonding pads B2 may be electrically connected to the pass transistors 230, respectively. For example, at least one of the second bonding pads B2 may be electrically connected to the pass transistor 230 by the third interconnection structure 240.

Subsequently, the first wafer W1 and the second wafer W2 may be bonded to each other. For example, an upper surface of the first wafer W1 and an upper surface of the second wafer W2 may be bonded to each other. The first bonding pads B1 of the first wafer W1 and the second bonding pads B2 of the second wafer W2 may be bonded to each other.

Furthermore, the first wafer W1 and the second wafer W2 may be bonded to each other so that the pass transistors 230 face the step structure of the stack 170 and the second peripheral circuit P2 faces the source structure 180. In other words, the first wafer W1 and the second wafer W2 may be bonded to each other so that the first contact plugs 190 electrically connected to the conductive layers 170B of the stack 170 face the pass transistors 230. Accordingly, the pass transistors 230 may be electrically connected to the conductive layers 170B through the first contact plugs 190, respectively.

According to the process described above, the stack 170, the channel structure CH, the first contact plug 190, the first peripheral circuit P1, the page buffer, and the like constituting the memory cell array may be formed on the first wafer W1, and the second peripheral circuit P2 and the pass transistors 230 related to the operation of the memory cell array of the first wafer W1 may be formed on the second wafer W2. Accordingly, by forming circuits related to the operation of the memory cell array on the separate second wafer W2, more memory cells may be formed on the first wafer W1, so that more data may be stored.

Furthermore, the bit line 150 may be formed below the cell region CR of the first wafer W1 and located to face the page buffer. The first contact plugs 190 may be formed above the contact region CTR of the first wafer W1 and located to face the pass transistors 230. The bit line 150 and the first contact plugs 190 may be formed at positions diagonally crossing each other. Accordingly, the page buffer and the bit line 150 may be disposed adjacent to each other, and a program operation and a read operation may be improved. The pass transistors 230 and the first contact plugs 190 may be disposed adjacent to each other, and the length of a bias transmission path may be reduced.

Although embodiments according to the technical idea of the present disclosure have been described above with reference to the accompanying drawings, this is only for explaining the embodiments according to the present disclosure, and the present disclosure is not limited to the above embodiments. Various types of substitutions, modifications, and changes for the embodiments may be made by those skilled in the art, to which the present disclosure pertains, without departing from the present disclosure, and it should be construed that these substitutions, modifications, and changes belong to the scope of the present disclosure.

What is claimed is:

1. A semiconductor device comprising:
a first semiconductor structure including a page buffer, a first peripheral circuit, a bit line located over the page buffer, a stack located over the bit line, and the stack including a) a step structure, b) a source structure located over the stack, and c) channel structures extending through the stack; and
a second semiconductor structure bonded to the first semiconductor structure, and the second semiconductor structure including a) a second peripheral circuit located to face an upper surface of the source structure and b) pass transistors located to face an upper surface of the step structure,
wherein the page buffer is at least partially overlapped with the pass transistors in a vertical direction.

2. The semiconductor device of claim 1, wherein the stack includes conductive layers respectively exposed through the step structure.

3. The semiconductor device of claim 2, further comprising:
first contact plugs connected to the conductive layers, respectively.

4. The semiconductor device of claim 3, wherein the conductive layers and the pass transistors are electrically connected to each other through the first contact plugs.

5. The semiconductor device of claim 2, wherein the second peripheral circuit includes a voltage generator that transmits a voltage to the conductive layers.

6. The semiconductor device of claim 1, wherein the first peripheral circuit includes a data input/output circuit or a logic circuit that controls the page buffer.

7. The semiconductor device of claim 1, further comprising:
a second contact plug that extends through the first semiconductor structure and electrically connects the first semiconductor structure and the second semiconductor structure to each other.

8. The semiconductor device of claim 1, wherein the first semiconductor structure includes a first bonding pad located above the stack.

9. The semiconductor device of claim 8, wherein the second semiconductor structure includes a second bonding pad that is bonded to the first bonding pad.

10. The semiconductor device of claim 1, wherein each of the pass transistors is a high voltage transistor.

11. A semiconductor device comprising:
a page buffer;
a bit line located over the page buffer;
a first interconnection structure connecting the page buffer and the bit line;
a stack located over the bit line and the stack including a) a step structure and b) conductive layers respectively exposed through the step structure;
first contact plugs located over the step structure and connected to the conductive layers, respectively and the first contact plugs being arranged at positions diagonally crossing the bit line;
a bonding structure located over the stack;
pass transistors located over the bonding structure; and
a second interconnection structure connecting the bonding structure and the pass transistors.

12. The semiconductor device of claim 11, wherein the page buffer is at least partially overlapped with the pass transistors in a vertical direction.

13. The semiconductor device of claim 11, wherein the conductive layers and the pass transistors are electrically connected to each other through the first contact plugs along a minimized connection path.

14. The semiconductor device of claim 11, wherein the bit line and the page buffer are electrically connected to each other through the first interconnection structure along a minimized connection path.

15. The semiconductor device of claim 11, wherein the second peripheral circuit includes a voltage generator that transmits a voltage to the conductive layers.

16. The semiconductor device of claim 11, wherein the first peripheral circuit includes a data input/output circuit or a logic circuit that controls the page buffer.

17. The semiconductor device of claim 11, further comprising:
a second contact plug electrically connecting the bonding structure and the first interconnection structure.

18. The semiconductor device of claim 11, wherein each of the pass transistors is a high voltage transistor.

* * * * *